March 28, 1967 R. S. GILLARD 3,311,840
BRIDGE TYPE CIRCUIT FOR CONTROLLING THE GAIN OF A TRANSISTOR AMPLIFIER
Filed May 27, 1964
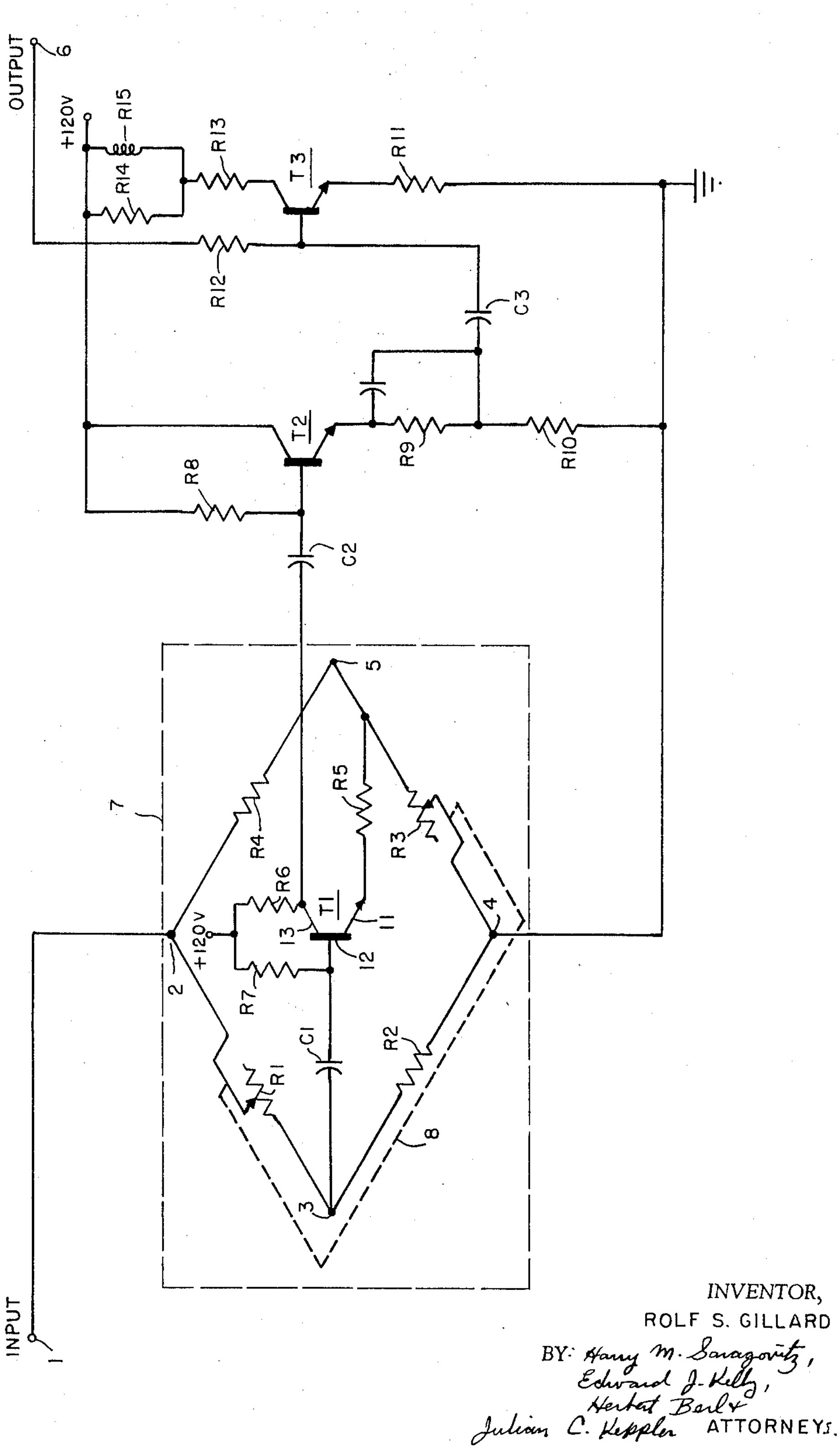
INVENTOR,
ROLF S. GILLARD
BY: Harry M. Saragovitz,
Edward J. Kelly,
Herbert Berl &
Julian C. Keppler ATTORNEYS.

United States Patent Office 3,311,840
Patented Mar. 28, 1967

3,311,840
BRIDGE TYPE CIRCUIT FOR CONTROLLING THE GAIN OF A TRANSISTOR AMPLIFIER

Rolf S. Gillard, San Jose, Calif., assignor to the United States of America as represented by the Secretary of the Army Filed May 27, 1964, Ser. No. 370,737
2 Claims. (Cl. 330—29)

This invention relates to transistor circuits, and more particularly to gain control for transistor amplifiers.

Generally speaking, it has not been possible to obtain high variations in gain in a transistor amplifier and at the same time maintain good fidelity of the amplified signal. The well known methods of using potentiometers or series resistors in the base circuit of a transistor cause changes in the RC relationship of the transistor and therefore changes in the rise time and fall time of an amplified pulse as the gain is changed from high to low. With my gain control circuit it is possible to obtain a high variation in gain in a transistor amplifier and at the same time maintain good fidelity of the amplified pulse.

Therefore, it is an object of my invention to provide a means for obtaining a high variation in gain in a transistor amplified accompanied by good fidelity of the amplified signal.

Another object of my invention is to provide gain control for a transistor amplifier.

These and other objects will be evident from the following detailed description when read with the accompanying drawing wherein the single figure shows a transistor amplifier utilizing my invention.

The figure shows a multi-stage transistor amplifier circuit. My invention is that portion of the figure within dashed block 7. The circuit outside of block 7 is a two stage transistor amplifier. The amplifier itself and the individual stages are conventional circuits and this circuitry is not a part of my invention. The two stage amplifier outside of block 7 is shown only to illustrate a typical application of my invention. Any other conventional transistor amplifier could be substituted for the two stage amplifier shown. Therefore, the following detailed description will be limited to the circuitry within block 7.

The gain control circuit is in general a bridge circuit having a transistor connected between two opposite points of the bridge. The arm of the bridge between the points 2 and 5 and the arm between the points 3 and 4 consist of fixed resistors R4 and R2 respectively. The arm of the bridge between the points 2 and 3 and the arm between the points 4 and 5 consist of variable resistors R1 and R3 respectively. In the embodiment shown resistors R2 and R4 were chosen to have a value of 1000 ohms each, and resistors R1 and R3 were chosen to have a maximum value of 1000 ohms each. Resistors R1 and R3 are gang tuned, as shown by the dash line 8, in such a manner that they will both be maximum or minimum at the same time. With the above given values of resistance the input impedance of the amplifier is maintained at a maximum value of two to one (500 ohms min. and 1000 max.).

The emitter 11 of transistor T1 is coupled to point 5 of the bridge through a resistor R5 and the base 12 of this transistor is coupled to point 3 of the bridge by coupling capacitor C1. The output of the bridge is taken from the collector 13 of transistor T1. The remaining circuit elements resistors R6 and R7 are used to couple the bias voltage source of 20 volts to collector 13 and base 12 respectively.

Input pulses from input terminal 1 are applied to point 2 of the bridge. Variable resistor R1 operates simply as a voltage divider, with resistor R2 in series to ground. Varying resistor R1 varies the signal voltage to base 12. Capacitor C1 is merely a signal coupling capacitor.

Variations in the resistance of resistor R3 has two effects. If the resistance of R3 is increased, the signal voltage applied to the emitter is increased. The signal voltage applied to emitter 11 is of course in phase with the signal voltage applied to base 12. Increasing resistor R3 also increases the total resistance in the transistor circuit from emitter to ground thus increasing the degeneration in the bridge transistor stage. These two effects operate together to produce a reduction in the output of transistor T1. If resistor R3 is decreased, the effects are opposite to those given above.

From the foregoing description of the operation, it can be seen that the output of transistor T1 is effectively a difference between the voltage applied to base 12 and the voltage applied to emitter 11. Therefore, it is possible to obtain gain figures in range from unity to very much less than unity. This range of gain is much higher than can be obtained with existing methods, and at the same time preserves the fidelity of the signal applied to the input.

While there has been disclosed what is considered at present to be the preferred embodiment of the invention, other modifications will readily occur to those skilled in the art. It is not, therefore, desired that the invention be limited to the specific arrangement shown and described, and it is intended to cover in the appended claims all such modifications as fall within the true spirit and scope of the invention.

What is claimed is:

1. A gain control circuit comprising: a resistive bridge circuit having first, second, third and fourth terminals; a first variable resistor connected between said first and second terminals; a first fixed resistor connected between said second and third terminals; a second variable resistor connected between said third and fourth terminals; a second fixed resistor connected between said fourth and first terminals; means to apply an input signal to said first terminal; means to connect said third terminal to ground; a transistor having a base electrode, a collector electrode and an emitter electrode; a capacitor connected between said second terminal and said base electrode; a third fixed resistor connected between said fourth terminal and said emitter electrode; and output circuit means coupled to said collector electrode.

2. A gain control circuit as defined in claim 1 wherein means are provided to simultaneously adjust said first and second variable resistors.

References Cited by the Examiner

UNITED STATES PATENTS 3,113,275 12/1963 Minter ---------- 331—110 X
3,159,796 12/1964 Van Sandwyk ---- 330—175 X

FOREIGN PATENTS 835,307 5/1960 Great Britain.

ROY LAKE, *Primary Examiner.*

J. B. MULLINS, *Assistant Examiner.*